(12) United States Patent
Miyazawa

(10) Patent No.: US 7,029,937 B2
(45) Date of Patent: Apr. 18, 2006

(54) SEMICONDUCTOR DEVICE AND METHOD OF MANUFACTURING THE SAME, CIRCUIT BOARD, AND ELECTRONIC INSTRUMENT

(75) Inventor: Ikuya Miyazawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/703,573

(22) Filed: Nov. 10, 2003

(65) Prior Publication Data

US 2004/0142574 A1 Jul. 22, 2004

Related U.S. Application Data

(63) Continuation of application No. PCT/JP03/03302, filed on Mar. 19, 2003.

(30) Foreign Application Priority Data

Mar. 19, 2002 (JP) .............................. 2002-076308
Jan. 15, 2003 (JP) .............................. 2003-007277

(51) Int. Cl.
*H01L 21/00* (2006.01)
*H01L 21/44* (2006.01)
*H01L 21/48* (2006.01)
*H01L 21/50* (2006.01)
*H01L 21/46* (2006.01)

(52) U.S. Cl. .............................. 438/40; 438/42; 438/700; 438/109; 438/656; 438/114; 438/754; 438/462; 438/657; 438/756; 438/465; 438/667; 438/459; 438/757; 438/597; 438/684; 438/691; 438/759; 438/614; 438/685; 438/692; 438/959; 438/653; 438/687; 438/696; 438/977; 438/654

(58) Field of Classification Search .................... None
See application file for complete search history.

(56) References Cited

U.S. PATENT DOCUMENTS

| | | | |
|---|---|---|---|
| 4,978,639 A | 12/1990 | Hua et al. | |
| 5,100,480 A * | 3/1992 | Hayafuji | ..................... 136/249 |
| 5,466,631 A | 11/1995 | Ichikawa et al. | ........... 438/406 |
| 5,504,036 A * | 4/1996 | Dekker et al. | ............... 438/666 |
| 5,767,001 A * | 6/1998 | Bertagnolli et al. | ......... 438/455 |
| 6,184,060 B1 * | 2/2001 | Siniaguine | .................. 438/106 |
| 6,322,903 B1 * | 11/2001 | Siniaguine et al. | ......... 428/617 |
| 6,420,209 B1 * | 7/2002 | Siniaguine | .................. 438/108 |
| 6,448,153 B1 * | 9/2002 | Siniaguine et al. | ......... 438/460 |
| 6,498,074 B1 * | 12/2002 | Siniaguine et al. | ......... 438/460 |

(Continued)

FOREIGN PATENT DOCUMENTS

JP A 60-7148 1/1985

(Continued)

*Primary Examiner*—David E. Graybill
(74) *Attorney, Agent, or Firm*—Oliff & Berridge, PLC

(57) ABSTRACT

A depression is formed from a first surface of a semiconductor substrate. An insulating layer is provided on the bottom surface and an inner wall surface of the depression. A conductive portion is provided inside the insulating layer. A second surface of the semiconductor substrate is etched by a first etchant having characteristics such that the etching amount with respect to the semiconductor substrate is greater than the etching amount with respect to the insulating layer, and the conductive portion is caused to project while covered by the insulating layer. At least a portion of the insulating layer formed on the bottom surface of the depression is etched with a second etchant having characteristics such that at least the insulating layer is etched without forming a residue on the conductive portion, to expose the conductive portion.

22 Claims, 10 Drawing Sheets

U.S. PATENT DOCUMENTS

| | | | |
|---|---|---|---|
| 6,498,381 B1 * | 12/2002 | Halahan et al. | 257/449 |
| 6,841,849 B1 | 1/2005 | Miyazawa | |
| 2001/0001215 A1 * | 5/2001 | Siniaguine et al. | 257/618 |
| 2001/0028105 A1 | 10/2001 | Nobuaki et al. | |
| 2001/0046276 A1 * | 11/2001 | Schneider et al. | 378/58 |
| 2002/0013061 A1 * | 1/2002 | Siniaguine et al. | 438/706 |
| 2002/0027293 A1 | 3/2002 | Masataka | |
| 2002/0084513 A1 * | 7/2002 | Siniaguine | 257/621 |
| 2002/0113321 A1 * | 8/2002 | Siniaguine | 257/782 |
| 2002/0115234 A1 * | 8/2002 | Siniaguine | 438/107 |
| 2002/0115260 A1 * | 8/2002 | Halahan et al. | 438/386 |
| 2002/0115290 A1 * | 8/2002 | Halahan et al. | 438/667 |
| 2003/0047798 A1 * | 3/2003 | Halahan | 257/685 |
| 2003/0085460 A1 * | 5/2003 | Siniaguine | 257/698 |
| 2003/0199123 A1 * | 10/2003 | Siniaguine | 438/118 |

FOREIGN PATENT DOCUMENTS

| | | |
|---|---|---|
| JP | A 60-7149 | 1/1985 |
| JP | 60098654 A * | 6/1985 |
| JP | 60098655 A * | 6/1985 |
| JP | 60235446 A * | 11/1985 |
| JP | 01244656 A * | 9/1989 |
| JP | A 2001-53218 | 2/2001 |
| JP | A 2001-326325 | 11/2001 |
| WO | WO 98/19337 | 5/1998 |

* cited by examiner

SEMICONDUCTOR DEVICE AND METHOD OF MANUFACTURING THE SAME, CIRCUIT BOARD, AND ELECTRONIC INSTRUMENT

CROSS REFERENCE TO RELATED APPLICATION

This application is a continuation of International Patent Application No. PCT/JP03/03302, having an international filing date of Mar. 19, 2003, which designated the United States, the entirety of which is incorporated herein by reference. Japanese Patent Application No. 2002-76308 filed on Mar. 19, 2002 and Japanese Patent Application No. 2003-7277 filed on Jan. 15, 2003 are also incorporated herein by reference in their entirety.

BACKGROUND OF THE INVENTION

The present invention relates to a semiconductor device and method of manufacturing the same, a circuit board, and an electronic instrument.

A semiconductor device for three-dimensional mounting has been developed. It is known to form electrodes penetrating a semiconductor chip, to enable three-dimensional mounting. The penetrating electrodes are formed to project from the semiconductor chip. In the conventionally known method of forming a penetrating electrode, a portion of silicon around the penetrating electrode is etched, whereby the penetrating electrode is caused to project. In this case, it is difficult to prevent the projecting portion of the penetrating electrode from being contaminated by the etching gas.

BRIEF SUMMARY OF THE INVENTION

The present invention solves the existing problems, and has as its object the formation of a penetrating electrode of high quality.

(1) According to one aspect of the present invention, there is provided a method of manufacturing a semiconductor device comprising:

(a) forming a depression from a first surface of a semiconductor substrate in which an integrated circuit is formed;

(b) providing an insulating layer on the bottom surface and an inner wall surface of the depression;

(c) providing a conductive portion inside the insulating layer;

(d) etching a second surface of the semiconductor substrate opposite to the first surface, with a first etchant having characteristics such that the etching amount with respect to the semiconductor substrate is greater than the etching amount with respect to the insulating layer, to cause the conductive portion to project while covered by the insulating layer;

(e) etching at least a portion of the insulating layer formed on the bottom surface of the depression with a second etchant having characteristics such that at least the insulating layer is etched without forming a residue on the conductive portion, to expose the conductive portion. According to this aspect of the present invention, the conductive portion is caused to project in the step (d), and the conductive portion is exposed in the step (e). In this way, a penetrating electrode projecting from the semiconductor substrate can be formed from the conductive portion. In the step (e), when the conductive portion is exposed from the insulating layer, no residues are left on the conductive portion, and therefore a penetrating electrode of high quality can be formed.

(2) In this method of manufacturing a semiconductor device, the first etchant may be one of $SF_6$, $CF_4$, and $Cl_2$ gases.

(3) In this method of manufacturing a semiconductor device, the step (d) may be carried out using a dry etching device.

(4) In this method of manufacturing a semiconductor device, the first etchant may be one of a liquid mixture of hydrofluoric acid and nitric acid, and a liquid mixture of hydrofluoric acid, nitric acid, and acetic acid.

(5) In this method of manufacturing a semiconductor device, the second etchant may be one of a gas mixture of argon and $CF_4$, and a gas mixture of $O_2$ and $CF_4$.

(6) In this method of manufacturing a semiconductor device, the step (e) may be carried out using a dry etching device.

(7) In this method of manufacturing a semiconductor device, the second etchant may be one of liquid hydrofluoric acid, and a liquid mixture of hydrofluoric acid and ammonium fluoride.

(8) In this method of manufacturing a semiconductor device, the insulating layer may be formed of one of $SiO_2$ and SiN.

(9) In this method of manufacturing a semiconductor device, an outer layer of the conductive portion may also be etched in the step (e).

(10) In this method of manufacturing a semiconductor device, the outer layer and a central portion of the conductive portion may be formed of different materials.

(11) In this method of manufacturing a semiconductor device, the central portion of the conductive portion may be formed of one of copper, tungsten, and doped polysilicon.

(12) In this method of manufacturing a semiconductor device, at least a part of the outer layer of the conductive portion may be formed of one of TiW, TiN, and TaN.

(13) This method of manufacturing a semiconductor device may further comprise, polishing the second surface of the semiconductor substrate up to a point before the insulating layer before the step (d)

(14) In this method of manufacturing a semiconductor device, the etching of the step (e) may have a lower etching rate with respect to the semiconductor substrate than the etching of the step (d).

(15) In this method of manufacturing a semiconductor device, the semiconductor substrate may be a semiconductor wafer having a plurality of the integrated circuits, the depression being formed for each of the integrated circuits, the method further comprising cutting the semiconductor substrate.

(16) In this method of manufacturing a semiconductor device, the step of cutting the semiconductor substrate may comprise:

forming a groove in the first surface, along a cutting line of the semiconductor substrate; and removing a bottom portion of the groove from the second surface so that the groove becomes a slit.

(17) In this method of manufacturing a semiconductor device, the groove may be formed by cutting.

(18) In this method of manufacturing a semiconductor device, the groove may be formed by etching.

(19) In this method of manufacturing a semiconductor device, the groove may be formed in the same process as the depression in the step (a).

(20) In this method of manufacturing a semiconductor device, the groove may be formed to be deeper than the depression; and a bottom portion of the groove may be removed by the polishing of the second surface of the semiconductor substrate.

(21) In this method of manufacturing a semiconductor device, the insulating layer may be provided also within the groove in the step (b).

(22) In this method of manufacturing a semiconductor device, part of the insulating layer formed on a bottom portion of the groove may be caused to project from the second surface in the step (d); and the part of the insulating layer formed on a bottom portion of the groove may be etched and removed by means of the second etchant in the step (e).

(23) In this method of manufacturing a semiconductor device, the step of removing the bottom portion of the groove may be carried out in a state that a material of the semiconductor substrate is exposed within the groove.

(24) In this method of manufacturing a semiconductor device, the bottom portion of the groove formed by a part of the semiconductor substrate may be etched and removed by means of the first etchant in the step (d).

(25) In this method of manufacturing a semiconductor device, the step of cutting the semiconductor substrate may be carried out with a protective sheet adhered to the first surface of the semiconductor substrate, so that a plurality of semiconductor chips obtained by cutting do not fall apart.

(26) In this method of manufacturing a semiconductor device, the groove may be formed only in regions sectioning the semiconductor substrate into a plurality of semiconductor chips having the plurality of integrated circuits.

(27) According to another aspect of the present invention, there is provided a method of manufacturing a semiconductor device, comprising:

laminating a plurality of semiconductor devices manufactured by the above described method; and making electrical connections between the semiconductor devices through the conductive portions.

(28) According to further aspect of the present invention, there is provided a semiconductor device manufactured by the above described method.

(29) According to still another aspect of the present invention, there is provided a circuit board on which is mounted the above described semiconductor device.

(30) According to still further aspect of the present invention, there is provided an electronic instrument having the above described semiconductor device.

DETAILED DESCRIPTION OF THE EMBODIMENT

Embodiments of the present invention are now described with reference to the drawings.

First Embodiment

Figure 1:
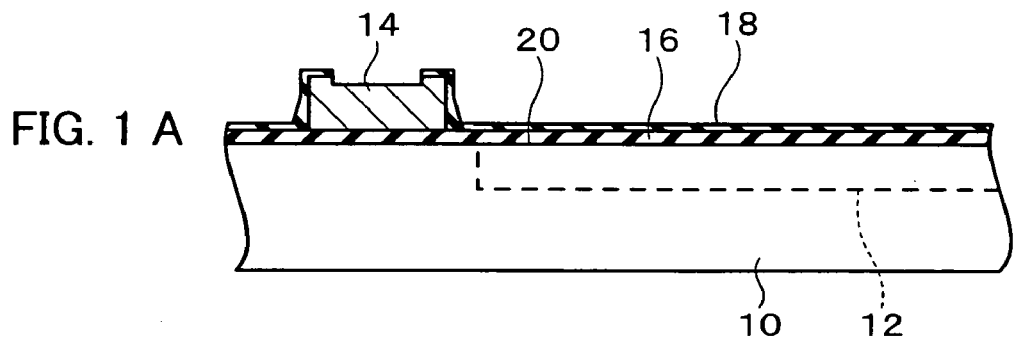
FIGS. 1A to 1D are diagrams for illustrating a method of manufacturing a semiconductor device according to a first embodiment of the present invention.
Figure 1:
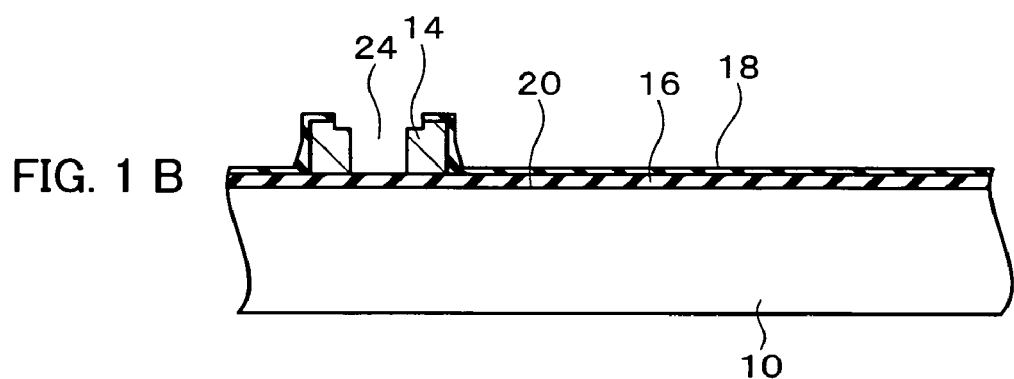
Figure 1:
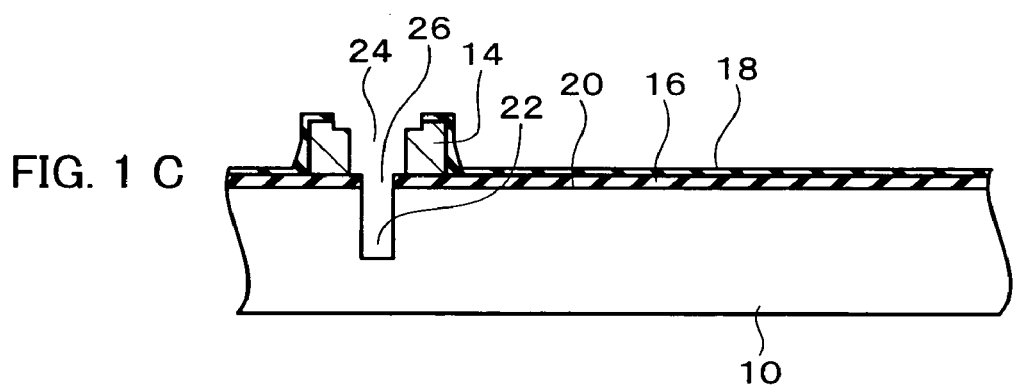
Figure 1:
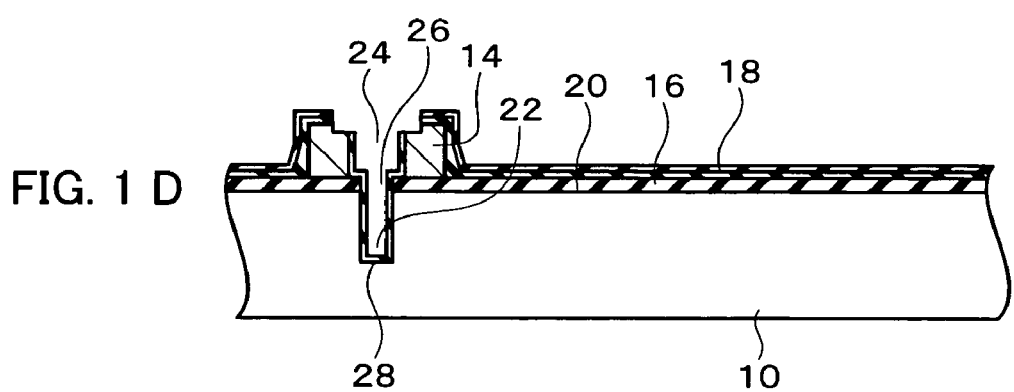
Figure 2:
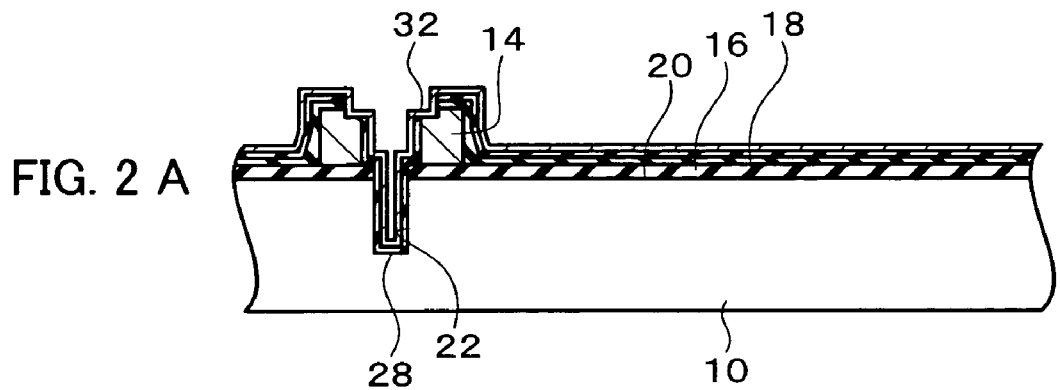
FIGS. 2A to 2D are diagrams for illustrating the method of manufacturing a semiconductor device according to the first embodiment of the present invention.
Figure 2:
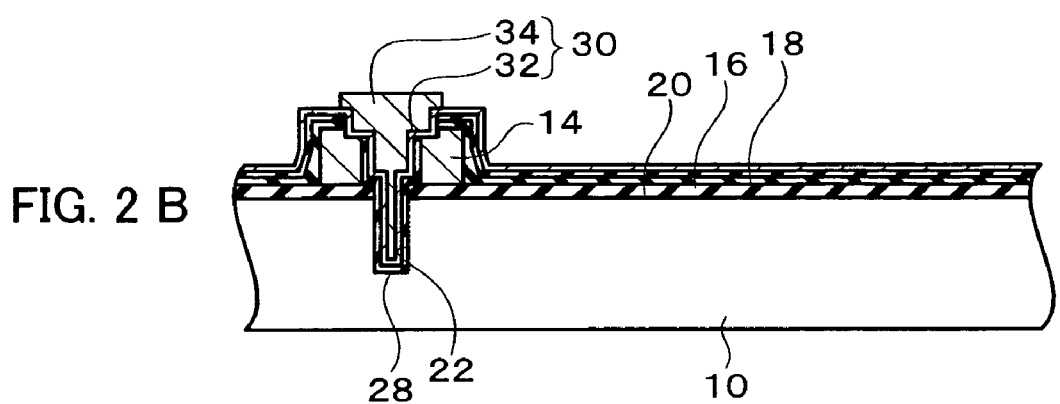
Figure 2:
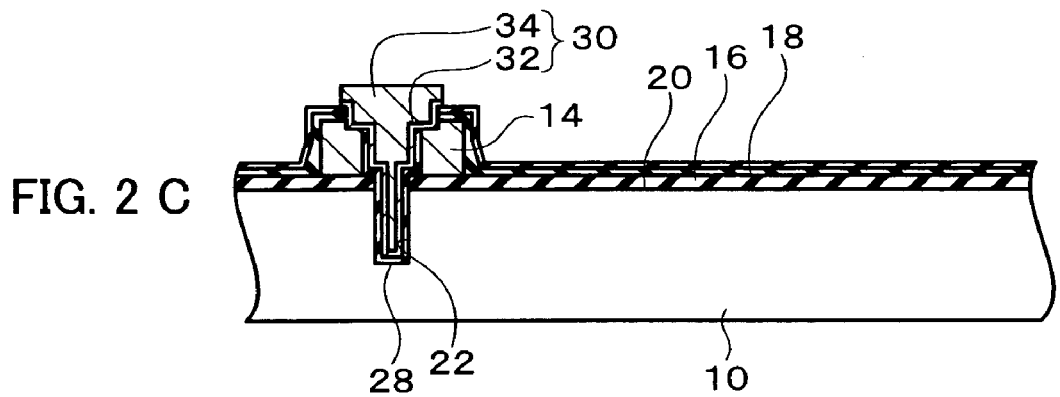
Figure 2:
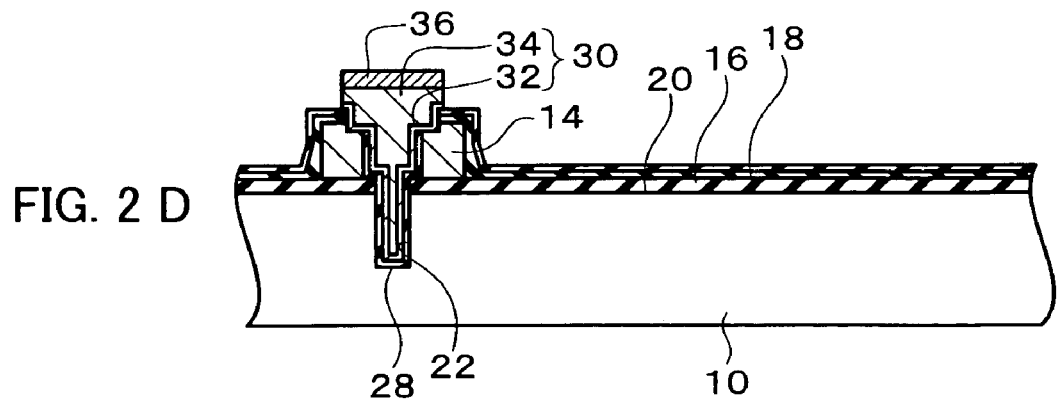

FIGS. 1A to 3C are diagrams for illustrating a method of manufacturing a semiconductor device according to a first embodiment of the present invention. In this embodiment, a semiconductor substrate 10 is used. The semiconductor substrate 10 shown in FIG. 1A is a semiconductor wafer, but it may be a semiconductor chip. On the semiconductor substrate 10 is formed at least one (a plurality on a semiconductor wafer; one on a semiconductor chip) integrated circuit (for example, a circuit comprising transistors or memory) 12. On the semiconductor substrate 10 are formed a plurality of electrodes (for example, pads) 14. Each electrode 14 is electrically connected to the integrated circuit 12. The electrodes 14 may be formed of aluminum. The surface form of the electrodes 14 is not particularly restricted, but is commonly rectangular. When the semiconductor substrate 10 is a semiconductor wafer, in each of the regions for the plurality of semiconductor chips, two or more (one group of) electrodes 14 are formed.

On the semiconductor substrate 10 are formed passivation films 16 and 18, of a single layer or more layers. The passivation films 16 and 18 can be formed of, for example, SiO$_2$, SiN, polyimide resin, or the like. In the example shown in FIG. 1A, on the passivation film 16, the electrodes 14, and interconnecting lines (not shown in the drawings) connecting the integrated circuit 12 and electrodes 14 are formed. The other passivation film 18 is formed so as to avoid at least a part of the surface of the electrodes 14. After forming the passivation film 18 to cover the surface of the electrodes 14, a part may be etched to expose a part of the electrodes 14. For the etching, either dry etching or wet etching may be applied. When etching the passivation film 18, the surface of the electrodes 14 may be etched.

In this embodiment, in the semiconductor substrate 10, a depression 22 (see FIG. 1C) is formed from a first surface 20 thereof. The first surface 20 is the surface on which the electrodes 14 are formed. The depression 22 is formed to avoid the elements and interconnecting lines of the integrated circuit 12. As shown in FIG. 1B, a through hole 24 may be formed in the electrodes 14. To form the through hole 24, etching (dry etching or wet etching) may be applied. The etching may be carried out after using a lithography process to form a patterned resist (not shown in the drawings). When the passivation film 16 is formed beneath the electrodes 14, a through hole 26 (see FIG. 1C) is also formed therein. When the etching of the electrodes 14 is stopped by the passivation film 16, for the formation of the through hole 26 the etchant used for etching the electrodes 14 may be replaced by a different etchant. In this case, once again, a patterned resist (not shown in the drawings) may be formed by a lithography process.

As shown in FIG. 1C, the depression 22 is formed in the semiconductor substrate 10 so as to communicate with the through hole 24 (and through hole 26). The through hole 24 (and through hole 26) and depression 22 can also be referred to collectively as a depression. For the formation of the depression 22, etching (dry etching or wet etching) can be applied. Etching may be carried out after forming a patterned resist (not shown in the drawings) by a lithography process. Alternatively, for the formation of the depression 22, a laser (for example, a CO$_2$ laser, a YAG laser, or the like) may be used. The laser may be applied to the formation of the through holes 24 and 26. The depression 22 and through holes 24 and 26 may also be formed together by the use of a single etchant or laser.

As shown in FIG. 1D, on the inner surface of the depression 22, an insulating layer 28 is formed. The insulating layer 28 may be an oxidation film. For example, if the material of the semiconductor substrate 10 is silicon, the insulating layer 28 may be of SiO$_2$ or SiN. The insulating layer 28 is formed on the bottom surface of the depression 22. The insulating layer 28 is formed on the inner wall of the depression 22. However, the insulating layer 28 is formed so as not to fill in the depression 22. That is to say, a depression is formed by the insulating layer 28. The insulating layer 28 may be formed on the inner wall of the through hole 26 in the passivation film 16. The insulating layer 28 may be formed over the passivation film 18.

The insulating layer 28 may be formed on the inner wall of the through hole 24 in the electrodes 14. The insulating layer 28 is formed to avoid a part of the electrodes 14 (for example, the top surface thereof). The insulating layer 28 may be formed to cover the whole surface of the electrodes 14, and then by partial etching (dry etching or wet etching), a part of the electrodes 14 exposed. The etching may be carried out after forming a patterned resist (not shown in the drawings) by a lithography process.

Next, a conductive portion 30 (see FIG. 2B) is provided inside the insulating layer 28. The conductive portion 30 may be formed of copper, tungsten, or the like. As shown in FIG. 2A, after an outer layer 32 of the conductive portion 30 is formed, a central portion 34 thereof may be formed. The central portion 34 can be formed of any of copper, tungsten, or doped polysilicon (for example, low temperature polysilicon). The outer layer 32 may include at least a barrier layer. The barrier layer prevents the material of the central portion 34 or of the seed layer described next from diffusing into the semiconductor substrate 10 (for example silicon). The barrier layer may be formed of a different material from the central portion 34 (for example, TiW, TiN, or TaN). If the central portion 34 is formed by electroplating, the outer layer 32 may include a seed layer. The seed layer is formed after forming the barrier layer. The seed layer is formed of the same material (for example copper) as the central portion 34. It should be noted that the conductive portion 30 (at least the central portion 34 thereof) may be formed by electroless plating or an inkjet method.

As shown in FIG. 2B, when the outer layer 32 is also formed over the passivation film 18, as shown in FIG. 2C, the part of the outer layer 32 over the passivation film 18 is etched. By forming the central portion 34 after the outer layer 32 is formed, the conductive portion 30 can be provided. A part of the conductive portion 30 is positioned within the depression 22 in the semiconductor substrate 10. Between the inner surface of the depression 22 and the conductive portion 30 is interposed the insulating layer 28, and therefore the two are electrically isolated. The conductive portion 30 is electrically connected to the electrodes 14. For example, a portion of the electrodes 14 exposed from the insulating layer 28 may contact the conductive portion 30. A part of the conductive portion 30 may be positioned over the passivation film 18. The conductive portion 30 may be provided only within the region of the electrodes 14. The conductive portion 30 may project, at least above the depression 22. For example, the conductive portion 30 may project from the passivation film 18.

It should be noted that as a variant, the central portion 34 may be formed with the outer layer 32 remaining on the passivation film 18. In that case, since a layer continuous with the central portion 34 is also formed over the passivation film 18, this layer is etched.

As shown in FIG. 2D, over the conductive portion 30, a brazing material layer 36 may be provided. The brazing material layer 36 is formed, for example, of solder, and may be formed of either of soft solder or hard solder. The brazing material layer 36 may be formed by covering regions other than the second conductive portion 32 with a resist. By the above process, bumps can be formed by the conductive portion 30 or with the addition of the brazing material layer 36.

Figure 3A:
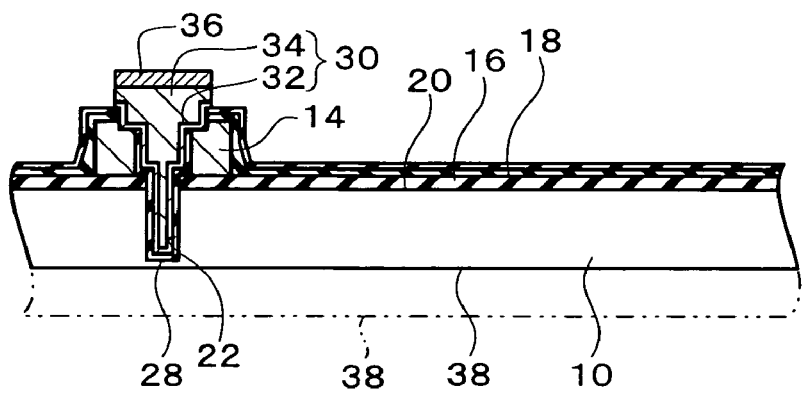
FIGS. 3A to 3C are diagrams for illustrating the method of manufacturing a semiconductor device according to the first embodiment of the present invention.

In this embodiment, as shown in FIG. 3A, a second surface of the semiconductor substrate 10 (the surface on the opposite side to the first surface 20) may be removed by, for example, at least one of mechanical polishing or grinding and chemical polishing or grinding. This process is carried out up to a point before the insulating layer 28 formed in the depression 22 is exposed. It should be noted that the process shown in FIG. 3A may be omitted, and next the process of FIG. 3B carried out.

Figure 3B:
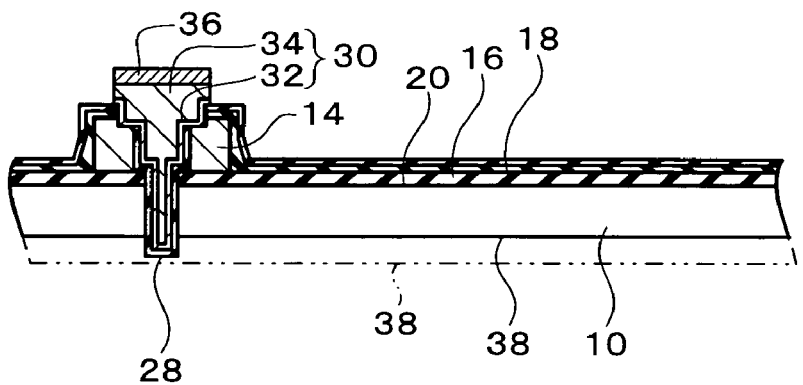

As shown in FIG. 3B, the second surface 38 of the semiconductor substrate 10 is etched so that the insulating layer 28 is exposed. The second surface 38 of the semiconductor substrate 10 is etched so that the conductive portion 30 (more precisely, the portion within the depression 22 thereof) projects while covered by the insulating layer 28. The etching is carried out with a first etchant, whose properties are such as to yield a greater etching amount with respect to the semiconductor substrate (for example, a silicon base material) 10 than with respect to the insulating layer (for example, formed of $SiO_2$) 28. The first etchant may be $SF_6$, $CF_4$, or $Cl_2$ gas. The etching may be carried out using a dry etching device. Alternatively, the first etchant may be a mixture of hydrofluoric acid and nitric acid, or a mixture of hydrofluoric acid, nitric acid, and acetic acid.

Figure 3C:
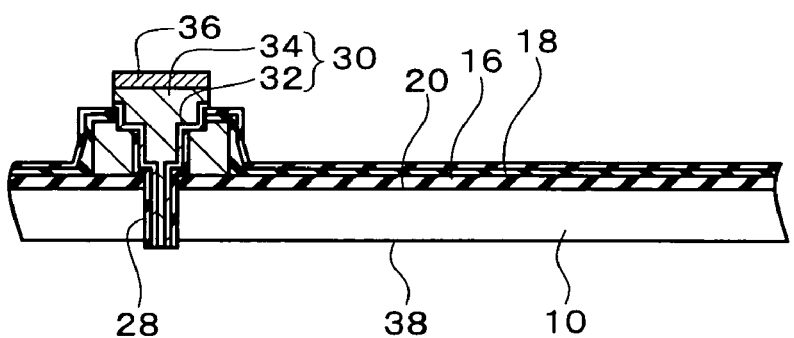

As shown in FIG. 3C, at least the portion of the insulating layer 28 formed on the bottom surface of the depression 22 is etched. Then the conductive portion 30 is exposed. The extreme surface of the conductive portion 30 may be exposed, and the peripheral surface of the extremity of the conductive portion 30 covered by the insulating layer 28. The outer layer 32 (for example, a barrier layer) of the conductive portion 30 may also be etched. The etching is carried out with a second etchant of characteristics such as to etch at least the insulating layer 28 without forming residues on the conductive portion 30. For the second etchant may be used an etchant which does not react (or has little reaction) with the material (for example, copper) of the conductive portion 30. The second etchant may be a mixture of argon and $CF_4$ gas, or a mixture of $O_2$ and $CF_4$ gas. The etching may be carried out using a dry etching device. Alternatively, the second etchant may be liquid hydrofluoric acid, or a liquid mixture of hydrofluoric acid and ammonium fluoride. The etching by the second etchant may have an etching rate with respect to the semiconductor substrate 10 which is slower than etching by the first etchant.

It should be noted that in at least one step in FIGS. 3A to 3C, a reinforcing member of, for example, resin layer or resin tape may be provided on the first surface 20 of the semiconductor substrate 10.

By the above process, the conductive portion 30 can be caused to project from the second surface 38 of the semiconductor substrate 10. The projecting conductive portion 30 forms a projecting electrode. The conductive portion 30 also forms penetrating electrodes of the first and second surfaces 20 and 38. According to this embodiment, when exposing the conductive portion 30 from the insulating layer 28, since no residues are left on the conductive portion 30, penetrating electrodes of high quality can be formed.

Figure 4:
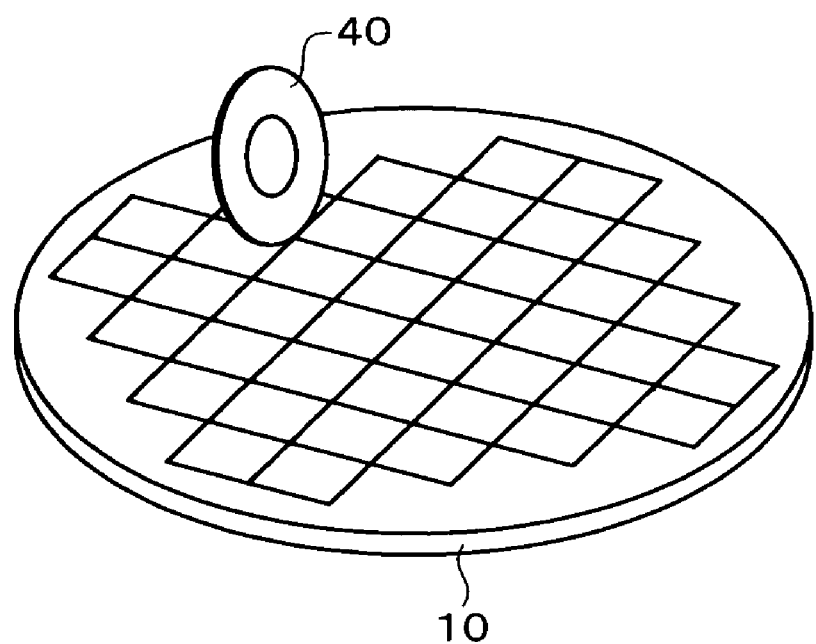
FIG. 4 is a diagram for illustrating the method of manufacturing a semiconductor device according to the first embodiment of the present invention.

As shown in FIG. 4, when the semiconductor substrate 10 is a semiconductor wafer, concavities 22 may be formed corresponding to individual integrated circuits 12 (See FIG. 1A), and the semiconductor substrate 10 may be cut (for example, by dicing). For the cutting, a cutter (for example, a dicer) 40 or laser (for example, a $CO_2$ laser, YAG laser, or the like) may be used.

Figure 5:
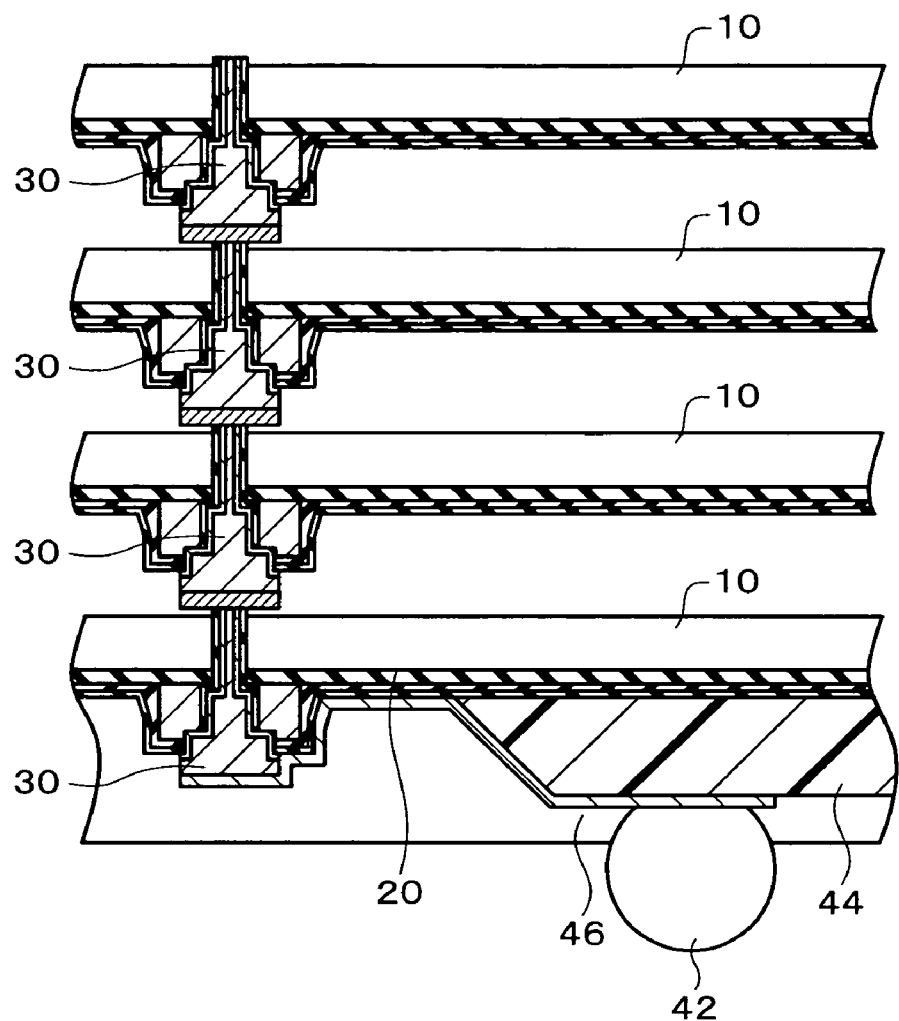
FIG. 5 is a diagram for illustrating the method of manufacturing a semiconductor device according to the first embodiment of the present invention.

By the above process, a semiconductor device can be manufactured. As shown in FIG. 5, a plurality of semiconductor devices manufactured by the above described method may be laminated, and electrical connection therebetween may be achieved through respective conductive portions 30. This embodiment is effective for carrying out such a three-dimensional mounting. The semiconductor device shown in FIG. 5 has a plurality of semiconductor substrates 10. In the direction of the first surface 20, the outermost positioned (in FIG. 5, the lowest) semiconductor substrate 10 has external terminals (for example, solder balls) 42. The external terminals 42 are provided on interconnecting lines 46 formed over a resin layer (for example, a stress relieving layer) 44. The interconnecting lines 46 are connected to the conductive portion 30 on the first surface 20.

Figure 6:
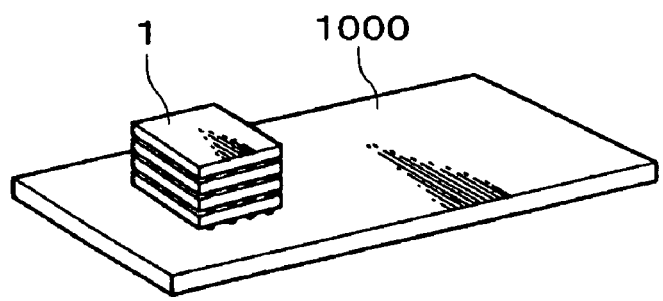
FIG. 6 is a diagram showing a circuit board according to the first embodiment of the present invention.
Figure 7:
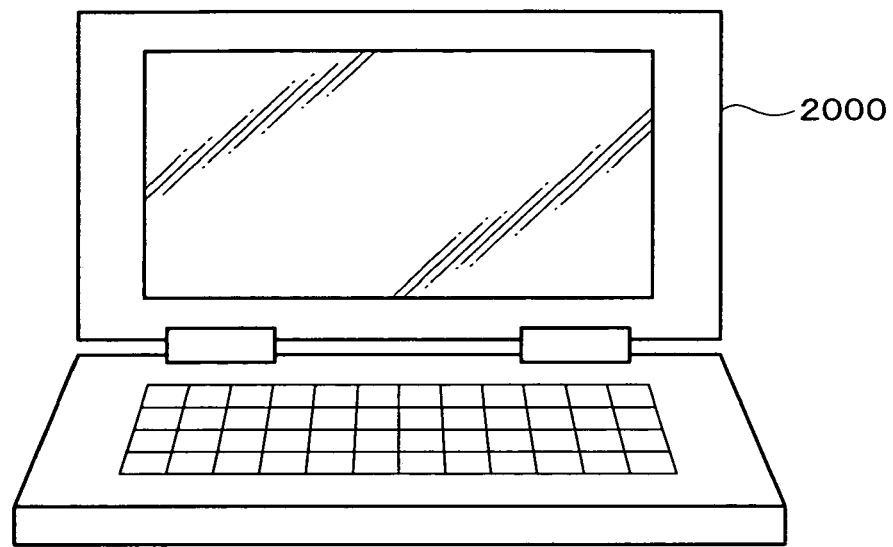
FIG. 7 is a diagram showing an electronic instrument according to the first embodiment of the present invention.
Figure 8:
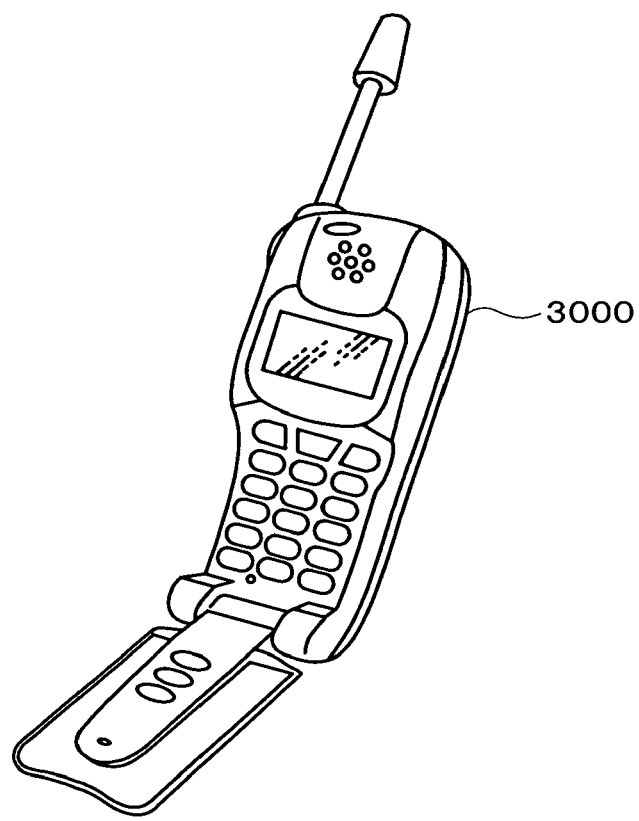
FIG. 8 is a diagram showing an electronic instrument according to the first embodiment of the present invention.

In FIG. 6 is shown a circuit board 1000 on which is mounted a semiconductor device 1, formed of a laminated plurality of semiconductor chips. The plurality of semiconductor chips is electrically connected by the above described conductive portion 30. As an electronic instrument having the above described semiconductor device, FIG. 7 shows a notebook personal computer 2000, and FIG. 8 shows a mobile telephone 3000.

Second Embodiment

Figure 9:
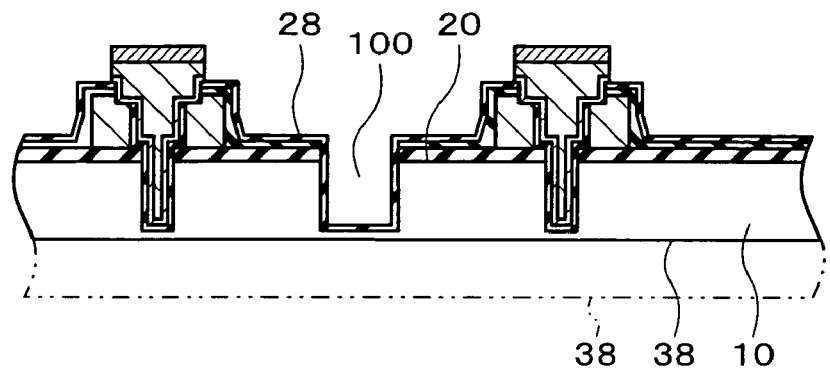
FIGS. 9A to 9C are diagrams for illustrating a method of manufacturing a semiconductor device according to a second embodiment of the present invention.
Figure 9:
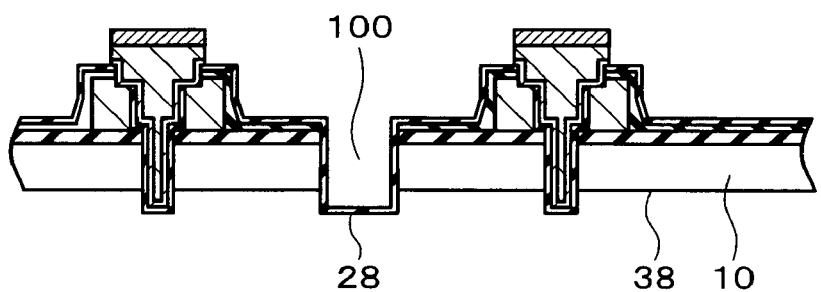
Figure 9:
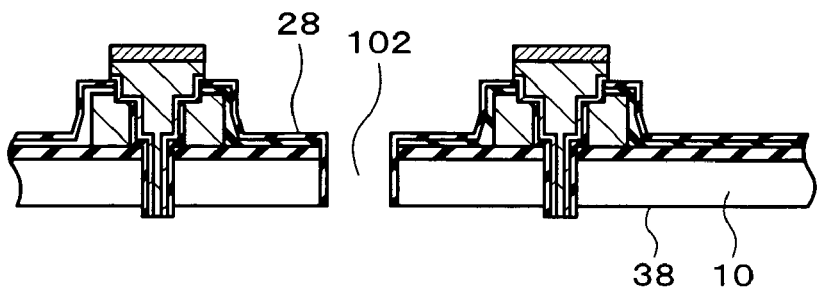

FIGS. 9A to 9C are diagrams for illustrating a method of manufacturing a semiconductor device according to a second embodiment of the present invention. In this embodiment, a groove 100 is formed in the semiconductor substrate 10 (more precisely, in the first surface 20 thereof). The groove 100 is formed along the cutting line of the semiconductor substrate 10. The groove 100 may be formed by cutting, or may be formed by etching. The groove 100 may be formed in the step of forming the depression 22 shown in FIG. 1C, with the same process (for example, at the same time) as the depression 22. The insulating layer 28 may be provided within the groove 100. The groove 100 may be of substantially the same depth as the depression 22, or may be deeper than the depression 22, or may be shallower than the depression 22.

Thereafter, the process described in FIGS. 3A to 3C in the first embodiment is carried out. FIGS. 9A to 9C show the configuration in the vicinity of the groove 100 when the respective steps shown in FIGS. 3A to 3C are carried out. For example, the process shown in FIG. 3A is carried out, and the second surface 38 of the semiconductor substrate 10 is polished to a point short of the insulating layer 28 (see FIG. 9A). The process shown in FIG. 3B is carried out, as shown in FIG. 9B, and the insulating layer 28 formed at the bottom of the groove 100 is caused to project from the second surface 38.

Then, the process shown in FIG. 3C is carried out, as shown in FIG. 9C, and by means of the second etchant, the insulating layer 28 formed at the bottom of the groove 100 is etched and removed. In this way, the bottom portion of the groove 100 is removed from the second surface, and the groove 100 becomes a slit 102. That is to say, the semiconductor substrate 100 is cut along the groove 100.

According to this embodiment, the semiconductor substrate 10 can be cut simply. Since final cutting of the semiconductor substrate 10 is carried out by means of the second etchant, chipping is not likely to occur. Furthermore, in this embodiment, since the insulating layer 28 is formed within the groove 100, the semiconductor chip has the insulating layer 28 on the edge surface. Therefore, this semiconductor chip is not susceptible to edge shorting. Other details are as described in the first embodiment.

Third Embodiment

Figure 10:
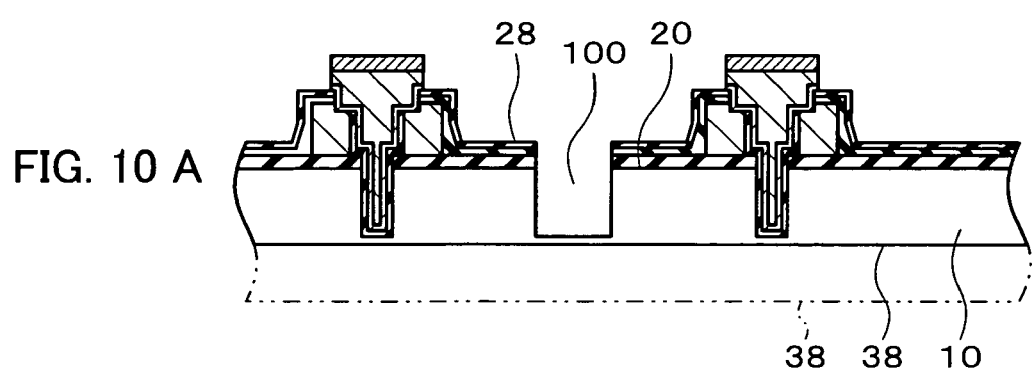
FIGS. 10A and 10B are diagrams for illustrating a method of manufacturing a semiconductor device according to a third embodiment of the present invention.
Figure 10:
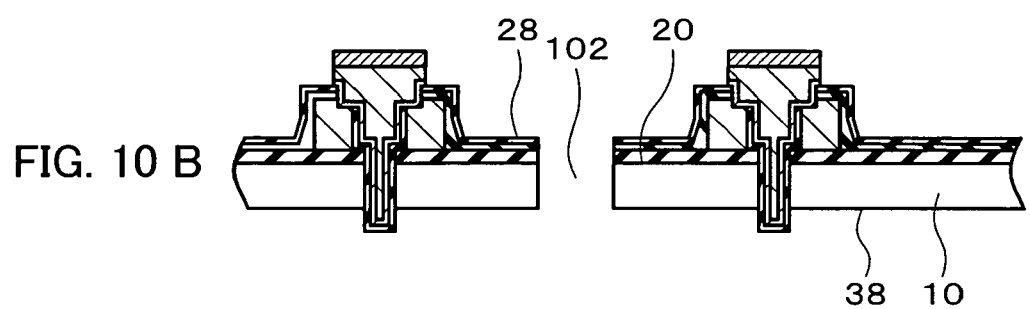

FIGS. 10A and 10B are diagrams for illustrating a method of manufacturing a semiconductor device according to a third embodiment of the present invention. In this embodiment, as shown in FIG. 10A, the process of removing the bottom portion of the groove 100 is carried out with the material of the semiconductor substrate 10 exposed within the groove 100. For example, after carrying out the process of forming the insulating layer 28 shown in FIG. 1D within the depression 22, the groove 100 may be formed, and in order that the insulating layer 28 is not attached, a resist or the like may be provided within the groove 100, or the insulating layer 28 which has entered the groove 100 may be removed. Other details are as described in the second embodiment.

In this embodiment, the process of FIG. 3B described in the first embodiment is carried out, and by means of the first etchant, the bottom portion of the groove 100 formed by a part of the semiconductor substrate 10 is etched and removed. In this way, as shown in FIG. 10B, the bottom portion of the groove 100 is removed from the second surface, and the groove 100 becomes the slit 102. That is to say, the semiconductor substrate 100 is cut along the groove 100. Other details are as described in the first and second embodiments.

Fourth Embodiment

Figure 11:
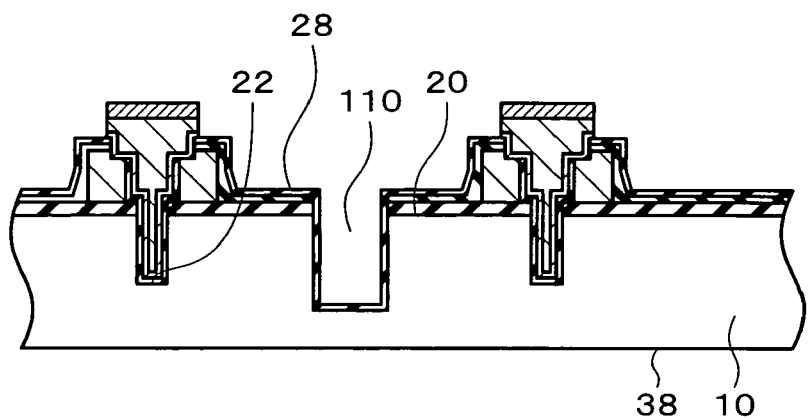
FIGS. 11A and 11B are diagrams for illustrating a method of manufacturing a semiconductor device according to a fourth embodiment of the present invention.
Figure 11:
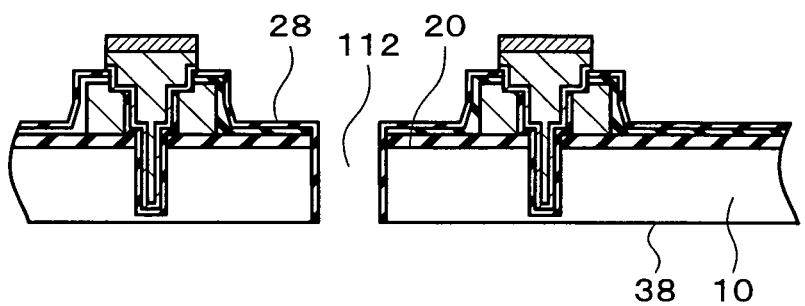

FIGS. 11A and 11B are diagrams for illustrating a method of manufacturing a semiconductor device according to a fourth embodiment of the present invention. In this embodiment, as shown in FIG. 11A, a groove 110 is formed to be deeper than the depression 22. The groove 110 deeper than the depression 22 can be formed easily, exploiting the etching characteristics (the property of etching deeper in a wider spaces).

Then as shown in Fig. FIG. 11B, by polishing the second surface 38 of the semiconductor substrate 10 (refer to the description relating to FIG. 3A), the bottom portion of the groove 110 is removed. In this way, the bottom portion of the groove 110 is removed from the second surface, and the groove 110 becomes a slit 112. That is to say, the semiconductor substrate 100 is cut along the groove 110. Other details are as described in the first, second, and third embodiments. In this embodiment, the semiconductor substrate 10 is cut while the insulating layer 28 is formed within the groove 110, but the semiconductor substrate 10 may equally be cut while the material of the semiconductor substrate 10 is exposed within the groove 110.

Fifth Embodiment

Figure 12:
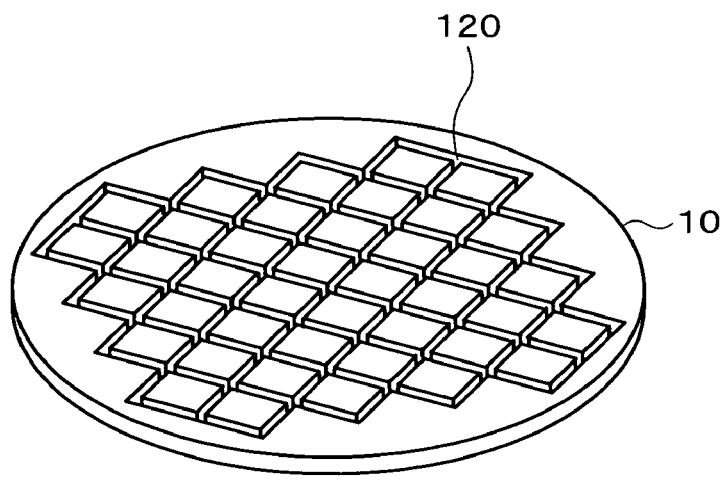
FIG. 12 is a diagram for illustrating a method of manufacturing a semiconductor device according to a fifth embodiment of the present invention.

FIG. 12 is a diagram for illustrating a method of manufacturing a semiconductor device according to a fifth embodiment of the present invention. The content of this embodiment can be applied to any from the second to the fourth embodiments. In this embodiment, a groove 120 is formed only in regions delineating a plurality of semiconductor chips having a plurality of integrated circuits 12 (See FIG. 1A). By this means, parts of the semiconductor substrate 10 that are not needed (for example, an outer peripheral portion) do not become separated, and damage to the semiconductor chip forming the product can be prevented.

Sixth Embodiment

Figure 13:
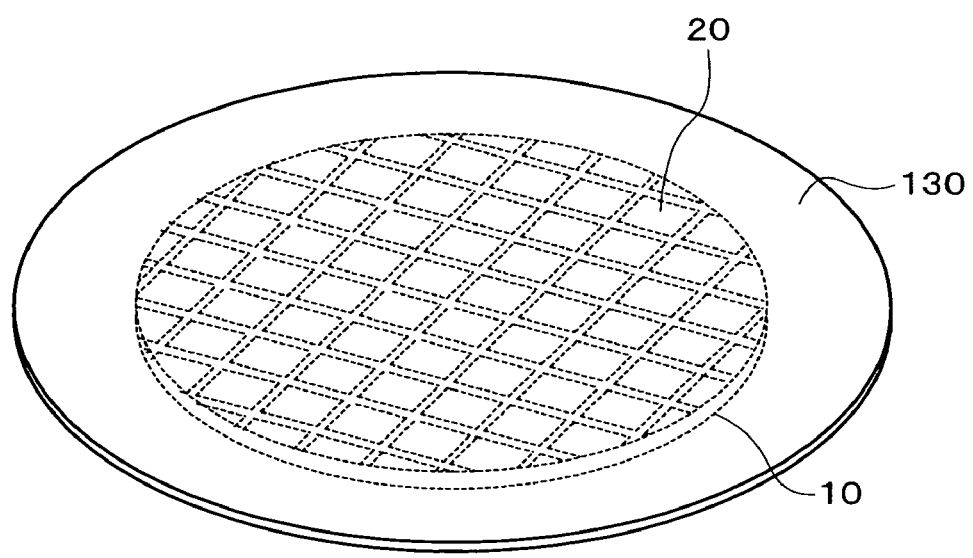
FIG. 13 is a diagram for illustrating a method of manufacturing a semiconductor device according to a sixth embodiment of the present invention.

FIG. 13 is a diagram for illustrating a method of manufacturing a semiconductor device according to a sixth embodiment of the present invention. In this embodiment, the step of cutting the semiconductor substrate 10 is carried out after attaching a protective sheet 130 to the first surface 20 of the semiconductor substrate 10. The protective sheet 130 may be an adhesive tape or adhesive sheet. By means of this, even when the semiconductor substrate 10 is cut, the plurality of semiconductor chips does not fall apart. The content of this embodiment can be applied to any from the first to the fifth embodiments.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of manufacturing a semiconductor device comprising:
   (a) forming a depression from a first surface of a semiconductor substrate in which an integrated circuit is formed, the semiconductor substrate having an electrode on the first surface, the electrode having an insulating film formed thereon;
   (b) providing an insulating layer on the bottom surface and an inner wall surface of the depression;
   (c) providing a conductive portion inside the insulating layer;
   (d) etching a second surface of the semiconductor substrate opposite to the first surface, with a first etchant having characteristics such that the etching amount with respect to the semiconductor substrate is greater than the etching amount with respect to the insulating layer, to cause the conductive portion to project while covered by the insulating layer;
   (e) etching at least a portion of the insulating layer formed on the bottom surface of the depression with a second etchant having characteristics such that at least the insulating layer is etched without forming a residue on the conductive portion, to expose the conductive portion,
   (a) including etching the insulating film to expose the electrode, etching the exposed surface of the electrode to form a depressed area, forming a hole in the depressed area of the electrode to expose the first surface, and then forming the depression from the first surface of the semiconductor substrate,
   in (c), the conductive portion being formed on the depressed area of the electrode.

2. The method as defined in claim 1, wherein the first etchant is one of a liquid mixture of hydrofluoric acid and nitric acid, and a liquid mixture of hydrofluoric acid, nitric acid, and acetic acid.

3. The method as defined in claim 1, wherein the second etchant is one of liquid hydrofluoric acid, and a liquid mixture of hydrofluoric acid and ammonium fluoride.

4. The method as defined in claim 1, wherein the insulating layer is formed of one of $SiO_2$ and SiN.

5. The method as defined in claim 1, wherein an outer layer of the conductive portion is also etched in the step (e).

6. The method as defined in claim 5, wherein the outer layer and a central portion of the conductive portion are formed of different materials.

7. The method as defined in claim 6, wherein the central portion of the conductive portion is formed of one of copper, tungsten, and doped polysilicon.

8. The method as defined in claim 6, wherein at least a part of the outer layer of the conductive portion is formed of one of TiW, TiN, and TaN.

9. The method as defined in claim 1, further comprising:
   polishing the second surface of the semiconductor substrate up to a point before the insulating layer before the step (d).

10. The method as defined in claim 1,
wherein the etching of the step (e) has a lower etching rate with respect to the semiconductor substrate than the etching of the step (d).

11. The method as defined in claim 1,
wherein the semiconductor substrate is a semiconductor wafer having a plurality of the integrated circuits, the depression being formed for each of the integrated circuits,
the method further comprising cutting the semiconductor substrate.

12. The method as defined in claim 11,
wherein the step of cutting the semiconductor substrate comprises:
forming a groove in the first surface, along a cutting line of the semiconductor substrate; and
removing a bottom portion of the groove from the second surface so that the groove becomes a slit.

13. The method as defined in claim 12,
wherein the groove is formed by etching.

14. The method as defined in claim 12,
wherein the groove is formed in the same process as the depression in the step (a).

15. The method as defined in claim 12, further comprising:
polishing the second surface of the semiconductor substrate up to a point before the insulating layer before the step (d),
wherein the groove is formed to be deeper than the depression; and
wherein a bottom portion of the groove is removed by the polishing of the second surface of the semiconductor substrate.

16. The method as defined in claim 12,
wherein the insulating layer is provided also within the groove in the step (b).

17. The method as defined in claim 16,
wherein part of the insulating layer formed on a bottom portion of the groove is caused to project from the second surface in the step (d); and
wherein the part of the insulating layer formed on a bottom portion of the groove is etched and removed by means of the second etchant in the step (e).

18. The method as defined in claim 12,
wherein the step of removing the bottom portion of the groove is carried out in a state that a material of the semiconductor substrate is exposed within the groove.

19. The method as defined in claim 18,
wherein the bottom portion of the groove formed by a part of the semiconductor substrate is etched and removed by means of the first etchant in the step (d).

20. The method as defined in claim 12,
wherein the step of cutting the semiconductor substrate is carried out with a protective sheet adhered to the first surface of the semiconductor substrate, so that a plurality of semiconductor chips obtained by cutting do not fall apart.

21. The method as defined in claim 12,
wherein the groove is formed only in regions sectioning the semiconductor substrate into a plurality of semiconductor chips having the plurality of integrated circuits.

22. A method of manufacturing a semiconductor device, comprising:
laminating a plurality of semiconductor devices manufactured by the method as defined in claim 1; and
making electrical connections between the semiconductor devices through the conductive portions.

* * * * *